(12) United States Patent
Keramat et al.

(10) Patent No.: US 9,130,519 B1
(45) Date of Patent: Sep. 8, 2015

(54) METHOD AND APPARATUS FOR COMBINED LINEAR, LOW-NOISE BUFFER AND SAMPLER FOR ADC

(71) Applicant: Apple Inc., Cupertino, CA (US)

(72) Inventors: Mansour Keramat, San Jose, CA (US); Ali Meaamar, San Jose, CA (US)

(73) Assignee: Apple Inc., Cupertino, CA (US)

( * ) Notice: Subject to any disclaimer, the term of this patent is extended or adjusted under 35 U.S.C. 154(b) by 58 days.

(21) Appl. No.: 13/826,050

(22) Filed: Mar. 14, 2013

(51) Int. Cl.
*H03F 1/02* (2006.01)
*H03F 3/45* (2006.01)

(52) U.S. Cl.
CPC .............. *H03F 3/45076* (2013.01); *H03F 1/02* (2013.01)

(58) Field of Classification Search
CPC .................................. H03F 1/02; H03K 17/00
USPC ...................................... 330/9, 86; 327/94, 91
See application file for complete search history.

(56) References Cited

U.S. PATENT DOCUMENTS 6,433,632 B1 * 8/2002 Nakamura et al. ................. 330/9
7,795,947 B2 * 9/2010 Zamprogno et al. ........... 327/337

* cited by examiner

*Primary Examiner* — Steven J Mottola
(74) *Attorney, Agent, or Firm* — Blakely, Sokoloff, Taylor & Zafman LLP

(57) ABSTRACT

A method and apparatus for combined linear, low-noise buffer and sampler for ADC (analog to digital converter) have been disclosed. In one implementation components contributing to sampling errors are included in a feedback path.

18 Claims, 6 Drawing Sheets

METHOD AND APPARATUS FOR COMBINED LINEAR, LOW-NOISE BUFFER AND SAMPLER FOR ADC

FIELD OF THE INVENTION

The present invention pertains to ADC (analog to digital converter). More particularly, the present invention relates to method and apparatus for combined linear, low-noise buffer and sampler for ADC.

BACKGROUND OF THE INVENTION

An ADC's accuracy is largely limited by the ADC's front end. One technique for an ADC front end is to use an operational amplifier where the voltage to be converted by the ADC is fed to an input resistor connected for example to the negative input of the operational amplifier, the positive input of the operational amplifier is connected to ground, the output of the operational amplifier is coupled through a feedback resistor to the negative input of the operational amplifier. This configuration establishes the gain of the ADC's front end. The output of the operational amplifier is then coupled to a switch. The switch when closed connects to a sampling capacitor. The sampling capacitor serves as the input to the ADC conversion circuitry. Noise in the ADC's front end introduces errors. Non-linearities in the ADC's front end introduces errors. Sampling errors introduce errors. This presents a technical problem for which a technical solution using a technical means is needed.

BRIEF DESCRIPTION OF THE DRAWINGS

The invention is illustrated by way of example and not limitation in the figures of the accompanying drawings in which.

DETAILED DESCRIPTION

The invention, in one embodiment, uses a bootstrap switch capacitor (SC) with a front-end low noise high linear buffer providing a low-noise low distortion sampled signal for high precision ADC (analog to digital conversion)

The invention, in one embodiment, uses a front-end switch capacitor (SC) sampler as a fundamental component, which samples a continuous input signal to provide discrete-time data. The accuracy of the SC such as linearity and noise, defines the overall performance of the ADC.

In one embodiment of the invention by using a bootstrapping technique, the linearity of the switch capacitor in sub-micron technologies is considerably improved.

In one embodiment of the invention, the use of a low noise high linear buffer at the front-end limits sampler noise contribution at the output.

In one embodiment of the invention, the sampler is composed of a high linear buffer and bootstrap switches to reach better noise as well as linearity at the sampler output. Since input and output of the front-end buffer experiences a full signal swing, linearity of the buffer will achieve high linearity.

Figure 3:
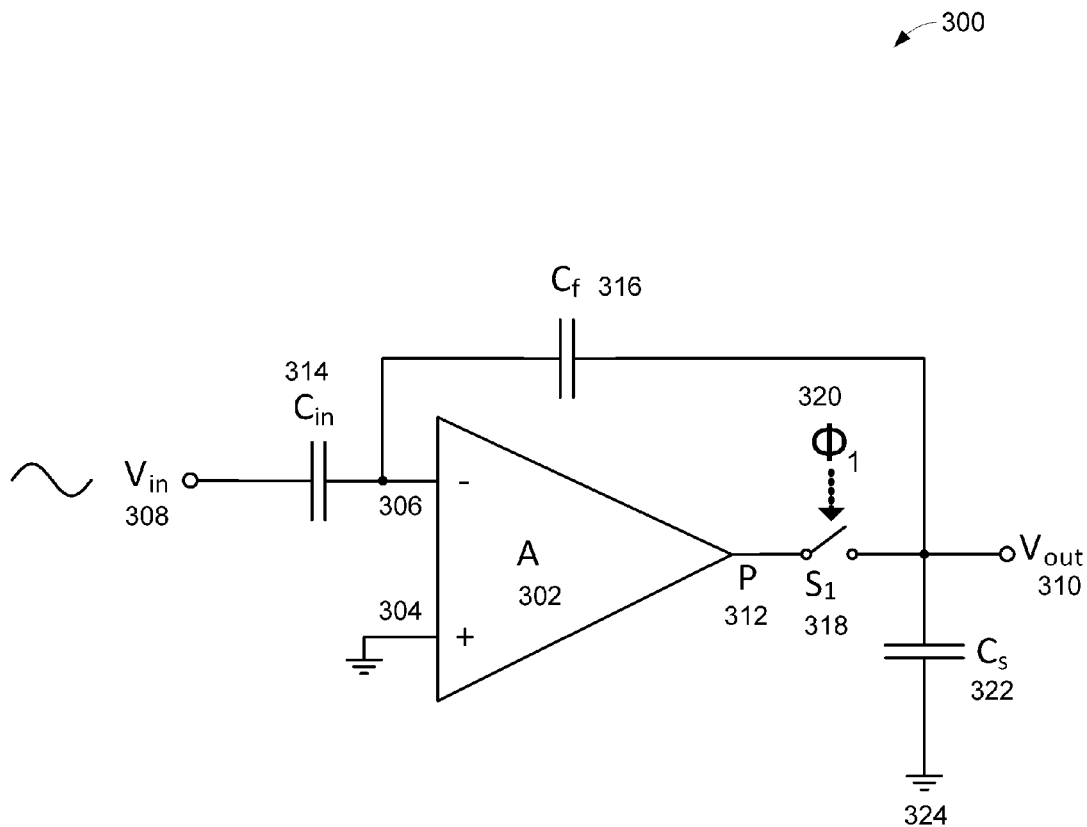
FIG. 3 illustrates one embodiment of the invention.

FIG. 3 illustrates, generally at 300, one embodiment of the invention. Switch S1 318 is inside the negative feedback path formed by amplifier A 302 output at P 312 going through switch S1 318 which is controlled by switching signal φ1 320 when switch S1 318 is closed and feedback capacitor Cf 316 feeding back to amplifier A 302 negative input 306. Amplifier A 302 positive input 304 is connected to ground 324. Vin 308 is coupled to amplifier A 302 negative input 306 through capacitor Cin 314. Vout 310 is coupled to sampling capacitor Cs 322. The other side of sampling capacitor Cs 322 is connected to ground 324.

While FIG. 3 illustrates the use of capacitors for input and feedback (Cin 314 and Cf 316 respectively) the invention is not so limited and other impedance type devices may be used, for example, resistors.

In FIG. 3, the negative feedback provides gain desensitization, which means that closed-loop gain is less sensitive to parameter changes. By increasing gain of the buffer (amplifier A 302), the accuracy of the closed-loop gain increases. Since switch S1 318 is placed inside the feedback loop, the on-resistance and nonlinearity of this switch S1 318 will be further suppressed by the feedback loop. For example, the higher the βα is, the less sensitive the system will be to the variations in α, where β is the feedback factor, and a is the gain of amplifier A 302. Therefore, the nonlinearities of switch S1 318 due to on-resistance are further reduced with higher buffer gain.

Figure 4:
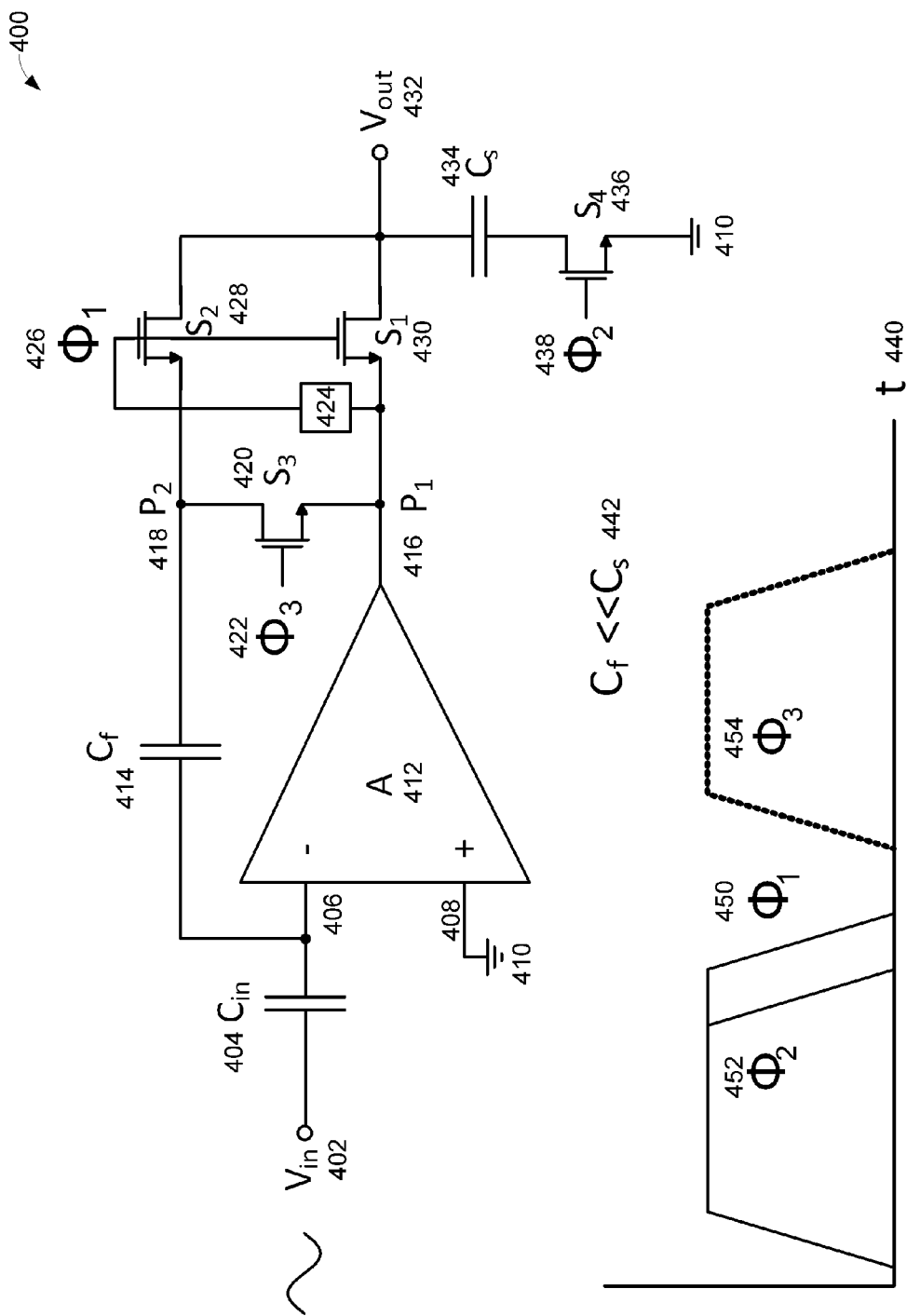
FIG. 4 illustrates one embodiment of the invention showing a different switch arrangement.

FIG. 4 illustrates, generally at 400, one embodiment of the invention. Circuit block 424 represents bootstrap circuitry to drive the gate of S2 428 and the gate of S1 430. Vin 420 is an input signal coupled through Cin 404 to amplifier A 412 negative input 406. Amplifier A 412 positive input 408 is coupled to ground 410. The output of amplifier A 412 is shown at P1 416. P1 416 is coupled to S1 430 and bootstrap circuitry 424. When φ1 426 is in one state S1 430 couples the output of amplifier A 412 at P1 416 to Vout 432. When φ1 426 is in one state S2 428 couples Vout 432 to P2 418. P2 418 is coupled to Cf 414 which is also coupled to amplifier A 412 negative input 406. When φ3 422 is in a one state S3 420 couples P1 416 to P2 418. Sampling capacitor Cs 434 is connected to Vout 432. The other side of sampling capacitor Cs 434 is connected to S4 436. When φ2 438 is in one state S4 436 couples sampling capacitor Cs 434 other side to ground 410.

In one embodiment of the invention, for example, as shown in FIG. 4, shown on the timeline t 440 are representative waveforms for φ1 426 at 450, φ2 438 at 452, and 100 3 422 at 454 during operation in one embodiment.

In one embodiment of the invention, for example, as shown in FIG. 4, Cf<<Cs 442.

In one embodiment of the invention, for example, as shown in FIG. 4, has two extra switches, S2 428 and S3 420 (as compared with FIG. 3). The clock configuration of this circuit in FIG. 4 is also plotted at t 440 to show the turn-on/off mechanism of the switches (S1 430, S2 428, S3 420, S4 436). Switch S3 420 is placed to avoid floating the output of the buffer 412 when switches S1 430 and S2 428 are off. The size of switches S1+S2 (430+428) is smaller than the size of switch S1 318 in FIG. 3. Since Cf is much smaller than Cs 442, the size of switch S2 428 can be chosen small, respectively. Smaller switch S2 428 size introduces less charge injection at node P2 418. Also signal variation on switch S2 428 will be small which means nonlinearity due to this switch (S2 428) is small. However, should the size of S2 428 be very small, high on-resistance can cause feedback instability due to increase in delay and reduction in phase margin. Therefore, the size of this switch (S2 428) is chosen carefully.

In one embodiment of the invention, for example, as shown in FIG. 4, the charge injection from switch S1 430 doesn't really change the charge on Cs 434 because of the use of a bottom-plate sampling structure. Gate-source voltage (Vgs) of switch S1 430 is bootstrapped (424) so as to reduce signal dependency of Vgs. The nonlinearity of S1 430 is further suppressed by the gain of the buffer 412. The output noise contribution by S1 430 is reduced by the gain of the buffer 412. By bootstrapping S1 430, linearity of this switch will further improve. Switch S4 436 makes sure that the charge on Cs 434 holds when sampling is performed.

In one embodiment of the invention, for example, as shown in FIG. 4, the benefit of the bootstrapping technique is in trade-off with charge injection at node P1 416. The charge injection of the bootstrap circuit introduces nonlinearity in the sampler. By looking at the nonlinearity of the bootstrap circuit as a variation of small-signal gain with the input level, the nonlinearity at node P1 416 is attenuated by the feedback loop. Therefore, the charge-injection-induced error of the bootstrap circuitry is negligible.

Figure 5:
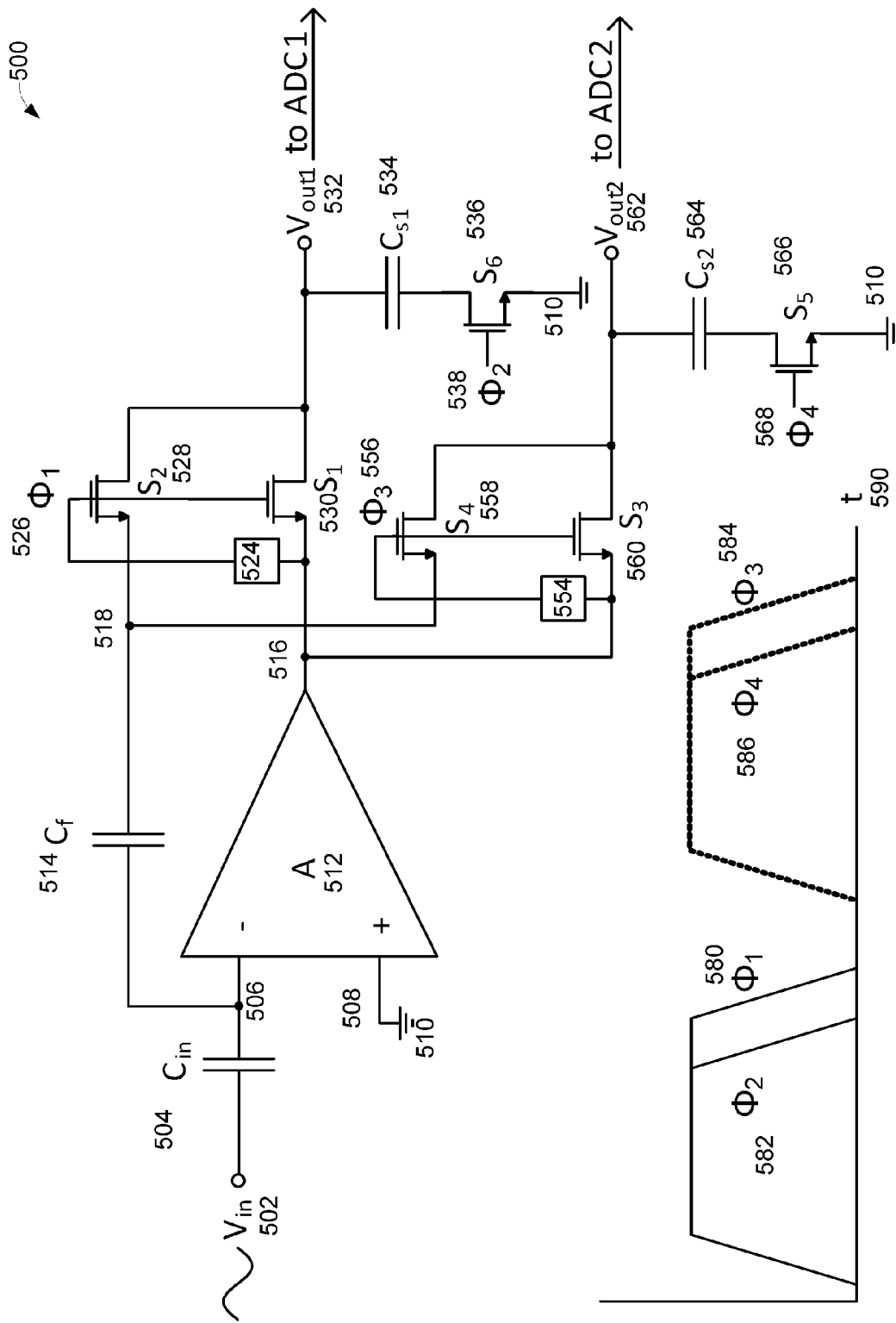
FIG. 5 illustrates one embodiment of the invention showing paths for two ADCs.

FIG. 5 illustrates, generally at 500, one embodiment of the invention. Circuit block 524 and circuit block 554 each represent bootstrap circuitry to drive the gates of S2 528 and S1 530, and S4 558 and S3 560 respectively. Vin 520 is an input signal coupled through Cin 504 to amplifier A 512 negative input 506. Amplifier A 512 positive input 508 is coupled to ground 510. The output of amplifier A 512 is shown at node 516. Node 516 is coupled to S1 530 and bootstrap circuitry 524 and S3 560 and bootstrap circuitry 554. When φ1 526 is in a high state S1 530 couples the output of amplifier A 512 at node 516 to Vout1 532. When φ1 526 is in a high state S2 528 couples Vout1 532 to node 518. Node 518 is coupled to Cf 514 which is also coupled to amplifier A 512 negative input 506. Sampling capacitor Cs1 534 is connected to Vout1 532. The other side of sampling capacitor Cs1 534 is connected to S6 536. When φ2 538 is in a high state S6 536 couples sampling capacitor Cs1 534 other side to ground 510.

When φ3 556 is in a high state S3 560 couples the output of amplifier A 512 at node 516 to Vout2 562. When φ3 526 is in a high state S4 558 couples Vout2 562 to node 518. Node 518 is coupled to Cf 514 which is also coupled to amplifier A 512 negative input 506. Sampling capacitor Cs2 564 is connected to Vout2 562. The other side of sampling capacitor Cs2 564 is connected to S5 566. When φ4 568 is in a high state S5 566 couples sampling capacitor Cs2 564 other side to ground 510.

In one embodiment of the invention, for example, as shown in FIG. 5, shown on the timeline t 590 are representative waveforms for φ1 526 at 580, φ2 538 at 582, φ3 556 at 584, and φ4 568 at 586 during operation in one embodiment.

In one embodiment of the invention, for example, as shown in FIG. 5 is an implementation for two paths of ADCs. In this architecture a single buffer drives two switch capacitor samplers, which are used for two paths of ADCs.

In one embodiment of the invention, for example, as shown in FIG. 5, while clock φ1 526 and φ2 538 are high, a first ADC path tracks the input signal, similarly when φ3 556 and φ4 568 are high, a second ADC path will track the input signal.

In one embodiment of the invention, for example, as shown in FIG. 5, in an actual implementation, a fully-differential topology is used to diminish the charge-injection effect as well as even-order nonlinearity.

In one embodiment of the invention, for example as shown in FIG. 3, FIG. 4, and FIG. 5 one or more or all of the components, switches, and buffer (amplifier) are fabricated on an integrated circuit.

The techniques disclosed may be used to time sample an input signal, as such the techniques may be used with a variety of ADCs for example a pipelined ADC, etc.

As one of skill in the art will appreciate the above techniques result in a low noise highly linear buffer and sampler to be utilized in high performance ADCs.

Figure 6:
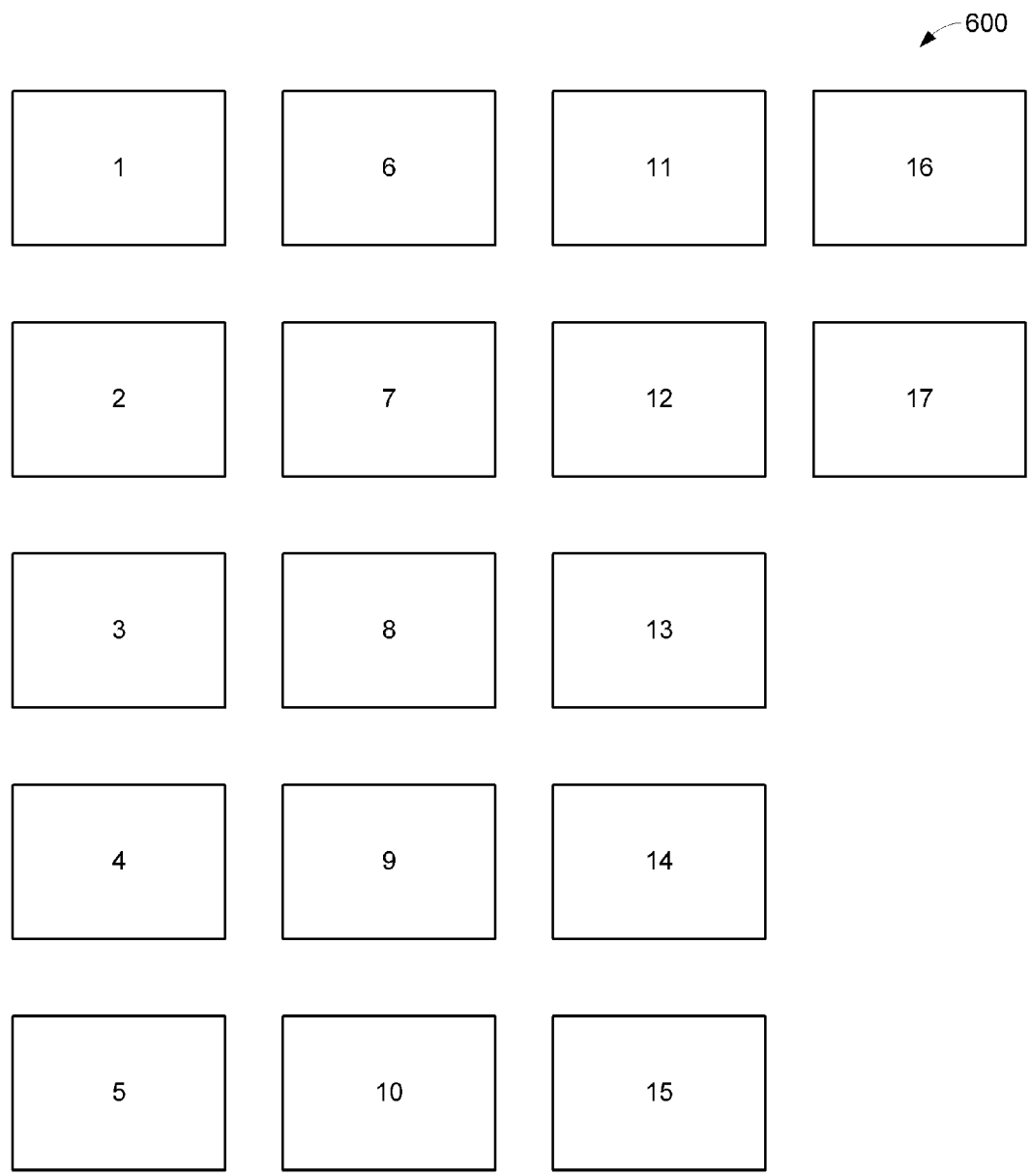
FIG. 6 illustrates various embodiments of the invention.

FIG. 6 illustrates various embodiments of the invention as indicated below.

Illustrated generally at 1. An apparatus comprising: an amplifier having a positive and negative input and an output, said amplifier positive input connected to a first reference supply; a first device having an input and an output, said first device input coupled to receive an input voltage, and said first device output coupled to said amplifier negative input; a switch having an input and an output, said switch input coupled to said amplifier output; and a second device having an input and an output, said second device input coupled to said switch output, and said second device output coupled to said amplifier negative input;

Illustrated generally at 2. The apparatus of claim 1 wherein said first reference supply is a ground.

Illustrated generally at 3. The apparatus of claim 2 wherein said first device is a capacitor.

Illustrated generally at 4. The apparatus of claim 3 wherein said second device is a capacitor.

Illustrated generally at 5. The apparatus of 4 further comprising; a third device having an input and an output, said third device input coupled to said switch output, and said third device output coupled to a second reference supply.

Illustrated generally at 6. The apparatus of claim 5 wherein said second reference supply is said ground.

Illustrated generally at 7. The apparatus of claim 6 wherein said third device is a capacitor.

Illustrated generally at 8. An apparatus comprising: an amplifier having a positive and negative input and an output, said amplifier positive input connected to a first reference supply; a first device having an input and an output, said first device input coupled to receive an input voltage, and said first device output coupled to said amplifier negative input; a first switch having an input, an output, and a control, said first switch input coupled to said amplifier output; a bootstrap circuit having an input and an output, said bootstrap circuit input coupled to said amplifier output and said bootstrap circuit output in operative communication with said first switch control; a second switch having an input, an output, and a control, said second switch input coupled to said first switch output, and said bootstrap circuit output in operative communication with said second switch control; a second device having an input and an output, said second device input coupled to said second switch output, and said second device output coupled to said amplifier negative input.

Illustrated generally at 9. The apparatus of claim 8 further comprising a third switch having an input, and an output, said third switch input coupled to said amplifier output, and said third switch output coupled to said second device input.

Illustrated generally at 10. The apparatus of claim 9 wherein said first reference supply is a ground, wherein said first device is a capacitor, and wherein said second device is a capacitor.

Illustrated generally at 11. The apparatus of 10 further comprising; a third device having an input and an output, said third device input coupled to said first switch output; a fourth switch having an input, and an output, said fourth switch input coupled to said third device output, and said fourth switch output coupled to a second voltage supply.

Illustrated generally at 12. The apparatus of claim 11 wherein said second voltage supply is said ground.

Illustrated generally at 13. The apparatus of claim 12 wherein said third device is a capacitor.

Illustrated generally at 14. A method comprising including a switch used for sampling an amplifier output to a sampling capacitor in a feedback loop of said amplifier.

Illustrated generally at 15. The method of claim 14 further comprising in order disconnecting said switch from said sampling capacitor and then disconnecting said sampling capacitor from said feedback loop, and then coupling an output from said amplifier to said feedback loop.

Illustrated generally at 16. The method of claim 15 wherein said disconnecting said switch from said sampling capacitor and said disconnecting said sampling capacitor from said feedback loop are performed by two switches.

Illustrated generally at 17. The method of claim 14 further comprising in order disconnecting at the same time said switch from said sampling capacitor and disconnecting said sampling capacitor from said feedback loop, and then subsequently coupling an output from said amplifier to said feedback loop.

Thus a method and apparatus for combined linear, low-noise buffer and sampler for have been described.

Because of the high speeds and noise considerations in embodiments of the present invention (for example, sampling variations) specialized hardware is required.

Figure 1:
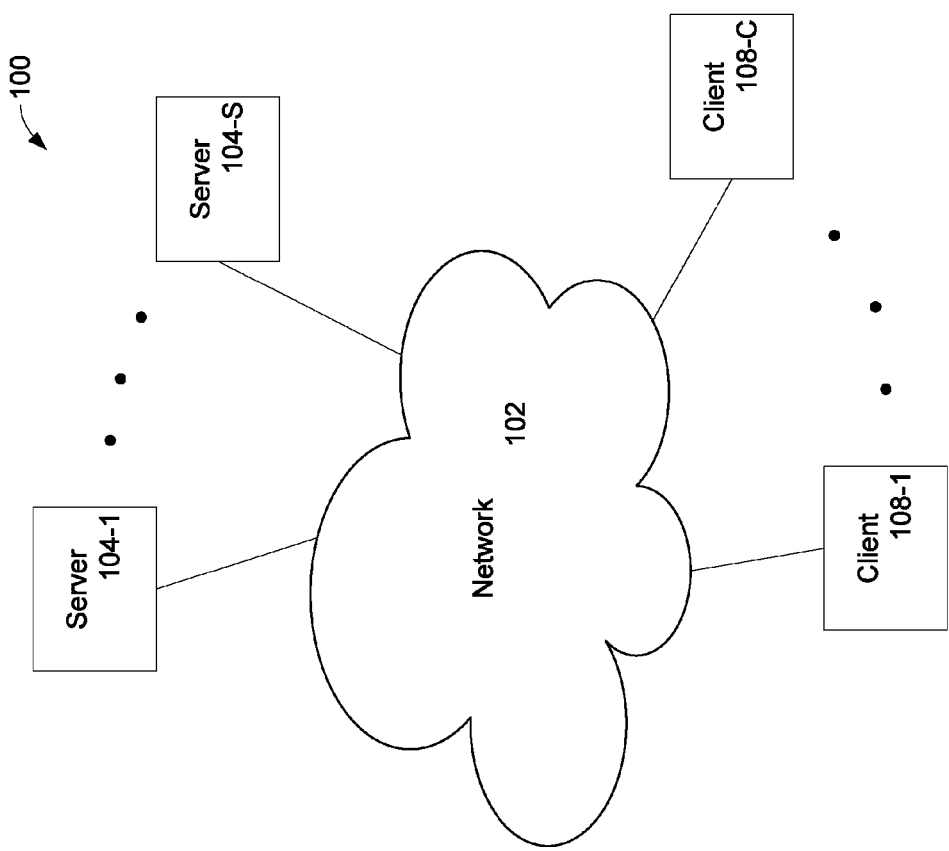
FIG. 1 illustrates a network environment in which the method and apparatus of the invention may be used.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
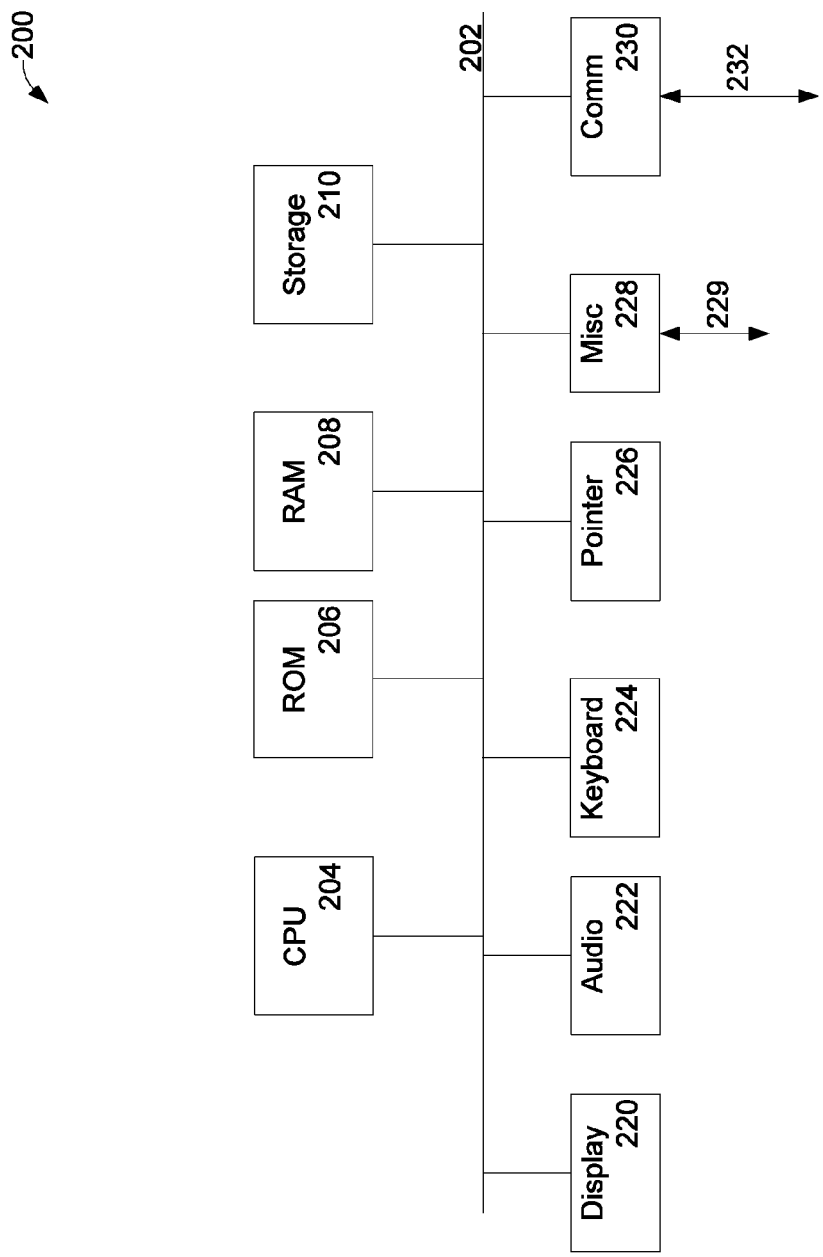
FIG. 2 is a block diagram of a computer system in which some embodiments of the invention may be used.

FIG. 2 is a block diagram of a computer system 200 which some embodiments of the invention may employ parts of in conjunction with required specialized hardware and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be accessed and/or controlled. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be accessed and/or controlled by essentially any type of communicating means or device whether local or remote, such as a LAN, a WAN, a system bus, etc. For example, a network connection which communicates via for example wireless may control an embodiment of the invention having a wireless communications device. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228 via link 229, and communications 230 via port 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc., all non-transitory medium. Display 220 might be, for example, used by an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate non-transitory physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a non-transitory computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of non-transitory media suitable for storing electronic instructions either local to the computer or remote to the computer.

The techniques presented herein are specifically related to particular computer or other apparatus. A specialized apparatus to perform the required methods is required. For example, any of the methods according to the present invention can be implemented in hard-wired circuitry specifically designed for the functionality disclosed, or by programming special hardware having, for example, in one embodiment, a particular machine such as a computer (or CPU) specifically designed with a 4 bit or greater barrel shift register and a carry look ahead arithmetic logic unit. As disclosed Applicant submits that any results are tied to a particular machine or apparatus and/or transform a particular article into a different state or thing and that such particulars and/or things are non-trivial. For example, in FIG. 2 at 220 is a display. The results of the specialized machine may return an electronic value and such a value can be stored in hardware on the specialized machine and transformed into a graphical representation that can be displayed to a user of the computer. For example, in one embodiment, the returned value may be stored as a group of physical electrons on a trapped gate of a flash memory device. These physical electrons may then be transformed into a graphical representation, for example, by twisting the molecules of a liquid crystal display so that a carrier signal can be modulated and produces on reception a molecular change in a rod and cone receptor of a human user to produce physical electrons thus producing a tangible useful result and transformation tied to a particular machine such as a computer specifically designed with a 4 bit or greater barrel shift register and a carry look ahead arithmetic logic unit. For example the specialized hardware is required for logical operations and comparisons of values. For example, in one embodiment, the returned value may be stored as a series of holes on a paper tape that may be read by a person (e.g. a blind person) by tactile sensation (e.g. output from a KSR-33 Teletype). As disclosed Applicant submits that these results are tied to a particular machine or apparatus and/or transform a particular article into a different state or thing and that such particulars and/or things are non-trivial and as such satisfy Bilski.

The methods of the invention may be implemented using computer software on the specialized hardware as noted supra. If written in a programming language conforming to a recognized standard, sequences of instructions designed to implement the methods can be compiled for execution on the specialized hardware. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action and produce a tangible concrete non-transitory result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a specialized computer system in which the techniques of the present invention may be practiced as well as implemented as an embodiment).

A machine-readable medium is understood to include any non-transitory mechanism for storing or transmitting information in a form readable by a machine (e.g., a computer). For example, a non-transitory machine-readable medium includes read only memory (ROM); random access memory (RAM); magnetic disk storage media; optical storage media; flash memory devices; devices having non-transitory storage.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as may be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for process compensated on-die constant delay have been described.

What is claimed is:

1. An apparatus comprising:
   an amplifier having a positive input and a negative input and an output, said amplifier positive input connected to a first reference supply;
   a first device having an input and an output, said first device input coupled to receive an input voltage, and said first device output coupled to said amplifier negative input;
   a switch having an input and an output, said switch input coupled to said amplifier output;
   a second device having an input and an output, said second device input coupled to said switch output, and said second device output directly connected to said amplifier negative input;
   a capacitor having an input and an output, said capacitor input being coupled to said switch output, and said capacitor output being coupled to a second reference supply; and
   an analog to digital converter whose input is coupled to the capacitor input.

2. The apparatus of claim 1 wherein said first reference supply is a ground.

3. The apparatus of claim 2 wherein said first device is a capacitor.

4. The apparatus of claim 3 wherein said second device is a capacitor.

5. The apparatus of claim 2 wherein said second reference supply is said ground.

6. An apparatus comprising:
   an amplifier having a positive input and a negative input and an output, said amplifier positive input connected to a first reference supply;
   a first device having an input and an output, said first device input coupled to receive an input voltage, and said first device output coupled to said amplifier negative input;
   a first switch having an input, an output, and a control, said first switch input coupled to said amplifier output;
   a bootstrap circuit having an input and an output, said bootstrap circuit input coupled to said amplifier output and said bootstrap circuit output in operative communication with said first switch control;
   a second switch having an input, an output, and a control, said second switch input coupled to said first switch output, and said bootstrap circuit output in operative communication with said second switch control; and
   a second device having an input and an output, said second device input coupled to said second switch output, and said second device output coupled to said amplifier negative input.

7. The apparatus of claim 6 further comprising a third switch having an input, and an output, said third switch input coupled to said amplifier output, and said third switch output coupled to said second device input.

8. The apparatus of claim 7 wherein said first reference supply is a ground, wherein said first device is a capacitor, and wherein said second device is a capacitor.

9. The apparatus of 8 further comprising;
   a third device having an input and an output, said third device input coupled to said first switch output;
   a fourth switch having an input, and an output, said fourth switch input coupled to said third device output, and said fourth switch output coupled to a second voltage supply.

10. The apparatus of claim 9 wherein said second voltage supply is said ground.

11. The apparatus of claim 10 wherein said third device is a capacitor.

12. A method for sampling an input signal, comprising:
    including a switch in a feedback loop of an amplifier between 1) an output of the amplifier and 2) an input of a sampling capacitor, while an output of the sampling capacitor is coupled to a reference supply, for sampling the amplifier output to the sampling capacitor, the method further comprising in order disconnecting said switch from said sampling capacitor and then disconnecting said sampling capacitor from said feedback loop, and then coupling an output from said amplifier to said feedback loop.

13. The method of claim 12 wherein said disconnecting said switch from said sampling capacitor and said disconnecting said sampling capacitor from said feedback loop are performed by two switches.

14. A method for sampling an input signal, comprising:
    including a switch in a feedback loop of an amplifier between 1) an output of the amplifier and 2) an input of a sampling capacitor, while an output of the sampling capacitor is coupled to a reference supply, for sampling the amplifier output to the sampling capacitor, the method further comprising in order disconnecting at the same time said switch from said sampling capacitor and disconnecting said sampling capacitor from said feedback loop, and then subsequently coupling an output from said amplifier to said feedback loop.

15. The apparatus of claim 1 further comprising a bootstrap circuit having an input coupled to the amplifier output and an output in operative communication with a control of the switch.

16. The apparatus of claim 1 further comprising an additional switch having 1) an input coupled to the switch output and 2) an output coupled to the second device input, such that the second device input is coupled to the capacitor input through the additional switch.

17. The apparatus of claim 16 further comprising:
    a second switch having a) an input coupled to the amplifier output and b) an output coupled to an input of a second capacitor;
    an additional second switch having an input coupled to the second switch output;
    a further analog-to-digital converter having an input coupled to the second capacitor input.

18. The apparatus of claim 1 further comprising an additional switch having an input coupled to the capacitor output so that the capacitor output is coupled to the second reference supply through the additional switch.

* * * * *